(12) United States Patent
Ito (10) Patent No.: US 8,648,849 B2
(45) Date of Patent: Feb. 11, 2014

(54) BUFFER CIRCUIT

(75) Inventor: Yoshiaki Ito, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 304 days.

(21) Appl. No.: 13/104,494

(22) Filed: May 10, 2011

(65) Prior Publication Data

US 2011/0279438 A1 Nov. 17, 2011

(30) Foreign Application Priority Data

May 13, 2010 (JP) .................................. 2010-110995

(51) Int. Cl.
*G09G 5/00* (2006.01)

(52) U.S. Cl.
USPC .......................................................... 345/212

(58) Field of Classification Search
USPC .......................................... 345/100, 211–212
See application file for complete search history.

(56) References Cited

U.S. PATENT DOCUMENTS

| 6,788,108 | B2 | 9/2004 | Miyake et al. |
| 6,928,136 | B2 | 8/2005 | Nagao et al. |
| 6,975,142 | B2 | 12/2005 | Azami et al. |
| 7,057,598 | B2 | 6/2006 | Azami et al. |
| 7,202,863 | B2 | 4/2007 | Kimura et al. |
| 7,301,533 | B2 | 11/2007 | Shin et al. |
| 7,432,737 | B2 | 10/2008 | Yoshida |
| 2004/0164978 | A1* | 8/2004 | Shin et al. ...................... 345/211 |
| 2008/0062112 | A1* | 3/2008 | Umezaki ........................ 345/100 |

FOREIGN PATENT DOCUMENTS

JP        2004-260788 A        9/2004

* cited by examiner

*Primary Examiner* — Quan-Zhen Wang
*Assistant Examiner* — Tony Davis
(74) *Attorney, Agent, or Firm* — Fish & Richardson P.C.

(57) ABSTRACT

A buffer circuit having high slew rate is provided. The buffer circuit is provided, which includes a plurality of transistors having the same conductivity type and a capacitor and whose gain is determined depending on the gain of all the plurality of transistors. A buffer circuit having high driving capability and high gain of a high-frequency component can be provided. Such a buffer circuit has also high slew rate. The plurality of transistors having the same conductivity type in the buffer circuit may be either p-channel transistors or n-channel transistors.

10 Claims, 4 Drawing Sheets

BUFFER CIRCUIT

BACKGROUND OF THE INVENTION

1. Field of the Invention

The present invention relates to a buffer circuit, a device to which the buffer circuit is applied, an electronic device, and the like.

2. Description of the Related Art

In recent years, display devices such as liquid crystal display devices and light-emitting devices are becoming widespread. In addition, with the development of the information society, the absolute quantity of information to be handled has been drastically increased; thus, memory devices or the like have been also developed.

In such display devices and memory devices, a plurality of transistors are provided in a matrix. The plurality of transistors provided in a matrix are controlled by scanning lines, and are supplied with data by signal lines. Note that such transistors formed over the same substrate preferably have the same conductivity type in order to improve the productivity.

The transistors are provided in a matrix over the substrate, and over this substrate, signals to be supplied to the scanning lines are supplied from a shift register circuit (see Patent Document 1, for example) or a buffer circuit.

However, in a conventional buffer circuit provided with transistors that have the same conductivity type (shown in FIG. 2, for example), the transistor, one of a source and a drain of which is connected to an output portion and the other of the source and the drain of which is connected to a power supply line (a high-potential-side power supply line $V_{dd}$ in the case of an n-channel transistor, and a low-potential-side power supply line $V_{ss}$ in the case of a p-channel transistor), acts to reduce the gain of the buffer circuit when the gain of the transistor itself is increased.

Note that the size of this transistor cannot be made sufficiently large in order to ensure the high gain of the buffer circuit and the slew rate of voltage of the output portion is determined depending on a value of current flowing from this transistor. Therefore, there is a problem in that the slew rate is difficult to improve.

Note that in this specification, the "slew rate" is a value obtained by dividing an output voltage by a rising time (in the case of an n-channel transistor) or a falling time (in the case of a p-channel transistor), and is also called a rising characteristic (in the case of the n-channel transistor) or a falling characteristic (in the case of the p-channel transistor).

REFERENCE

Patent Document

[Patent Document 1] Japanese Published Patent Application No. 2004-260788

SUMMARY OF THE INVENTION

An object of one embodiment of the present invention is to provide a buffer circuit having high slew rate.

Another object is to form such a buffer circuit having high slew rate with the use of transistors having the same conductivity type. When the transistors in the buffer circuit have the same conductivity type (n-type or p-type), the buffer circuit can be manufactured through a simple process; thus, productivity can be increased.

Another object is to simplify the structure of the buffer circuit that can solve the above problem, and make the area occupied by the buffer circuit small.

In one embodiment of the present invention, in order to increase the slew rate of a buffer circuit, the driving capability is improved and the gain of a high-frequency component is improved.

A buffer circuit according to one embodiment of the present invention includes at least a plurality of transistors and a capacitor. The gain of the buffer circuit is determined depending on the gain of all the plurality of transistors.

A buffer circuit according to one embodiment of the present invention includes a first transistor; a second transistor; a third transistor; a fourth transistor; a fifth transistor; a sixth transistor; a capacitor; an input portion; and an output portion. A first terminal of the first transistor and a third terminal of the first transistor are connected to a high-potential-side power supply line. A second terminal of the first transistor is connected to a first terminal of the second transistor and a third terminal of the third transistor. A second terminal of the second transistor is connected to a low-potential-side power supply line. A third terminal of the second transistor is connected to the input portion of the buffer circuit. A first terminal of the third transistor is connected to the high-potential-side power supply line. A second terminal of the third transistor is connected to a first terminal of the fourth transistor and a third terminal of the fifth transistor. A second terminal of the fourth transistor is connected to the low-potential-side power supply line. A third terminal of the fourth transistor is connected to the input portion of the buffer circuit. A first terminal of the fifth transistor is connected to the high-potential-side power supply line. A second terminal of the fifth transistor is connected to a first terminal of the sixth transistor and the output portion of the buffer circuit. A second terminal of the sixth transistor is connected to the low-potential-side power supply line. A third terminal of the sixth transistor is connected to the input portion of the buffer circuit. The second terminal of the first transistor is connected to the output portion of the buffer circuit through the capacitor. The first transistor, the second transistor, the third transistor, the fourth transistor, the fifth transistor, and the sixth transistor are each an n-channel transistor.

In the above buffer circuit, the first transistor, the second transistor, the third transistor, the fourth transistor, the fifth transistor, and the sixth transistor each preferably include an oxide semiconductor.

A buffer circuit according to another embodiment of the present invention includes a first transistor; a second transistor; a third transistor; a fourth transistor; a fifth transistor; a sixth transistor; a capacitor; an input portion; and an output portion. A first terminal of the first transistor is connected to a high-potential-side power supply line. A second terminal of the first transistor is connected to a first terminal of the second transistor and a third terminal of the fourth transistor. A third terminal of the first transistor is connected to the input portion of the buffer circuit. A second terminal of the second transistor and a third terminal of the second transistor are connected to a low-potential-side power supply line. A first terminal of the third transistor is connected to the high-potential-side power supply line. A second terminal of the third transistor is connected to a first terminal of the fourth transistor and a third terminal of the sixth transistor. A third terminal of the third transistor is connected to the input portion of the buffer circuit. A second terminal of the fourth transistor is connected to the low-potential-side power supply line. A first terminal of the fifth transistor is connected to the high-potential-side power supply line. A second terminal of the fifth transistor is connected to a first terminal of the sixth transistor and the output portion of the buffer circuit. A third terminal of the fifth transistor is connected to the input portion of the buffer circuit. A second terminal of the sixth transistor is connected to the low-potential-side power supply line. The second terminal of the first transistor is connected to the output portion of the buffer circuit through the capacitor. The first transistor, the second transistor, the third transistor, the fourth transistor, the fifth transistor, and the sixth transistor are each a p-channel transistor.

Note that in this specification, a "first terminal" means one of a source and a drain, and a "second terminal" means the other thereof. In addition, a "third terminal" means a gate.

Note that in this specification, the "gain" means a ratio of an output voltage to an input voltage.

Note that in this specification, the "driving capability" means the capability to output current to an output load.

Note that in this specification, an "n-channel transistor" means all transistors which are turned on when a gate voltage (a gate potential relative to a source potential) is higher than the threshold voltage. A "p-channel transistor" means all transistors which are turned on when a gate voltage (a gate potential relative to a source potential) is lower than the threshold voltage. Therefore, the terms "n-channel" and "p-channel" do not limit matters other than those defined as above.

Note that here, the "slew rate" is determined depending on the gain and the driving capability. In the case where the driving capability is low, it takes time to charge an output load (a capacitor) even when the gain is high. On the other hand, in the case where the driving capability is high and the gain is low, it takes time to sufficiently increase $V_{gs}$ of a transistor of the last stage; accordingly, it takes time to utilize the high driving capability. Therefore, in order to improve the slew rate, the gain is increased and the driving capability is made sufficiently high.

A buffer circuit having high driving capability and high gain of a high-frequency component can be provided. Such a buffer circuit has also high slew rate.

Further, since such a buffer circuit having high slew rate can be formed using transistors having the same conductivity type, it can be manufactured through a simple process. In other words, the slew rate of a buffer circuit provided with transistors that have the same conductivity type can be improved, which has been conventionally difficult.

Furthermore, the structure of such a buffer circuit having the above effect is simplified as much as possible, whereby the area occupied by the buffer circuit can be made small.

DETAILED DESCRIPTION OF THE INVENTION

Embodiments of the present invention will be hereinafter described in detail with reference to the accompanying drawings. Note that the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments below.

[Embodiment 1]

In this embodiment, a buffer circuit provided with n-channel transistors, which is one embodiment of the present invention, will be described.

Figure 1:
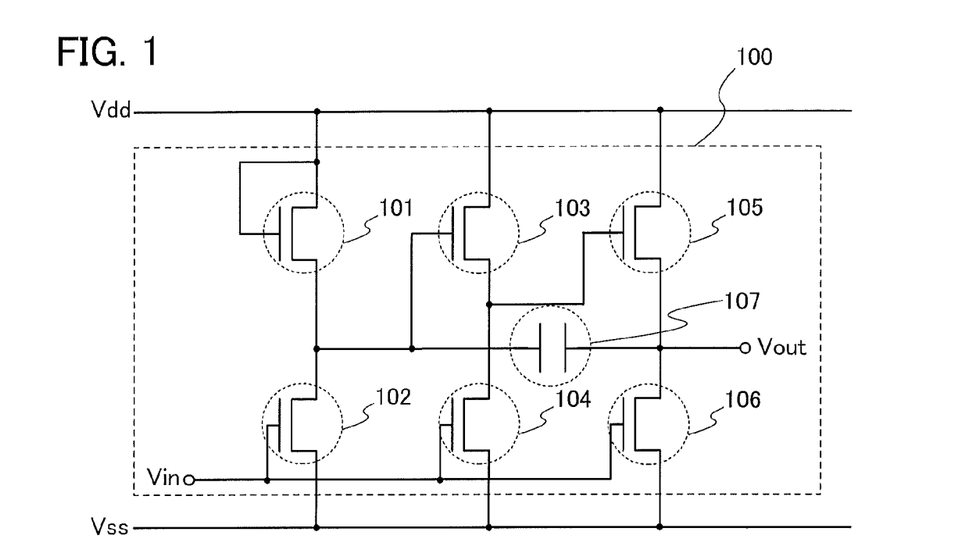
FIG. 1 illustrates a buffer circuit of Embodiment 1, which is one embodiment of the present invention.

FIG. 1 illustrates a buffer circuit 100 which is one embodiment of the present invention.

The buffer circuit 100 illustrated in FIG. 1 includes first to sixth transistors, a capacitor, an input portion, and an output portion. A first terminal and a third terminal of a first transistor 101 are connected to a high-potential-side power supply line $V_{dd}$, and a second terminal thereof is connected to a first terminal of a second transistor 102 and a third terminal of a third transistor 103. A second terminal of the second transistor 102 is connected to a low-potential-side power supply line $V_{ss}$, and a third terminal thereof is connected to an input portion $V_{in}$ of the buffer circuit 100. A first terminal of the third transistor 103 is connected to the high-potential-side power supply line $V_{dd}$, and a second terminal thereof is connected to a first terminal of a fourth transistor 104 and a third terminal of a fifth transistor 105. A second terminal of the fourth transistor 104 is connected to the low-potential-side power supply line $V_{ss}$, and a third terminal thereof is connected to the input portion $V_{in}$ of the buffer circuit 100. A first terminal of the fifth transistor 105 is connected to the high-potential-side power supply line $V_{dd}$, and a second terminal thereof is connected to a first terminal of a sixth transistor 106 and an output portion $V_{out}$ of the buffer circuit 100. A second terminal of the sixth transistor 106 is connected to the low-potential-side power supply line $V_{ss}$, and a third terminal thereof is connected to the input portion $V_{in}$ of the buffer circuit 100. The second terminal of the first transistor 101 is connected to the output portion $V_{out}$ through a capacitor 107.

The buffer circuit 100 illustrated in FIG. 1 has high driving capability and high gain of a high-frequency component. Further, the buffer circuit illustrated in FIG. 1 has high slew rate. Since the buffer circuit 100 illustrated in FIG. 1 can be formed using transistors having the same conductivity type, it can be manufactured through a simple process. In other words, the slew rate of a buffer circuit provided with transistors that have the same conductivity type can be improved, which has been conventionally difficult. In addition, the buffer circuit can be formed with six transistors and one capacitor, whereby the area occupied by the buffer circuit is small.

Here, when the gain of the first transistor 101 is expressed by $g_1$, the gain of the second transistor 102 is expressed by $g_2$, the gain of the third transistor 103 is expressed by $g_3$, the gain of the fourth transistor 104 is expressed by $g_4$, the gain of the fifth transistor 105 is expressed by $g_5$, the gain of the sixth transistor 106 is expressed by $g_6$, the angular frequency of an input signal is expressed by s ($=2\pi f$ (f represents frequency)), and the electrostatic capacitance of the capacitor 107 is expressed by C, the gain of the buffer circuit 100 illustrated in FIG. 1 can be expressed by the following mathematical formula (1).

[Mathematical Formula 1]

$$G = -\left(\frac{g_4 g_5 (g_1 + sC)}{g_1 g_3 (g_5 + sC)} + \frac{g_6 (g_1 + sC)}{g_1 (g_5 + sC)} + \frac{g_2}{g_1}\right) \quad (1)$$

That is, s is significantly large when the frequency is high ($g_1$, $g_5 \ll sC$), so that the gain of the high-frequency component is expressed by the following mathematical formula (2) when the equation $1/s=0$ is satisfied.

[Mathematical Formula 2]

$$G_H = -\left(\frac{g_4 g_5}{g_1 g_3} + \frac{g_6}{g_1} + \frac{g_2}{g_1}\right) \quad (2)$$

In addition, s is significantly small when the frequency is low ($g_1$, $g_5 \gg sC$), so that the gain of the low-frequency component is expressed by the following mathematical formula (3) when the equation $s=0$ is satisfied.

[Mathematical Formula 3]

$$G_L = -\left(\frac{g_4}{g_3} + \frac{g_6}{g_5} + \frac{g_2}{g_1}\right) \quad (3)$$

Here, the above mathematical formula (1) is obtained in the following manner. When a current flowing between the first terminal and the second terminal of the first transistor 101 is expressed by $I_1$, a current flowing between the first terminal and the second terminal of the third transistor 103 is expressed by $I_3$, a current flowing between the first terminal and the second terminal of the fifth transistor 105 is expressed by $I_5$, and a current flowing between two electrodes of the capacitor 107 is expressed by $I_7$, the following mathematical formulae (4) to (7) are obtained.

[Mathematical Formula 4]

$$I_1 = g_1(0 - V_a) = g_2(V_{in} - 0) + I_7 \quad (4)$$

[Mathematical Formula 5]

$$I_3 = g_3(V_a - V_b) = g_4(V_{in} - 0) \quad (5)$$

[Mathematical Formula 6]

$$I_5 = g_5(V_b - V_{out}) = g_6(V_{in} - 0 - i\, I_7) \quad (6)$$

[Mathematical Formula 7]

$$I_7 = sC(V_a - V_{out}) \quad (7)$$

Note that here, $V_a$ represents the potential of a node connected to the third terminal of the third transistor 103, and $V_b$ represents the potential of a node connected to the third terminal of the fifth transistor 105. The solution of the above mathematical formulae (4) to (7) which includes neither $V_a$ nor $V_b$ leads to the above mathematical formula (1).

With the use of the buffer circuit 100 illustrated in FIG. 1, the gain of the high-frequency component can be increased. This is because, by increasing the gain of the fifth transistor 105, the gain of the buffer circuit 100 is increased when the frequency is high.

In order to explain technical characteristics of the buffer circuit illustrated in FIG. 1, which is one embodiment of the present invention, another buffer circuit is described.

Figure 2:
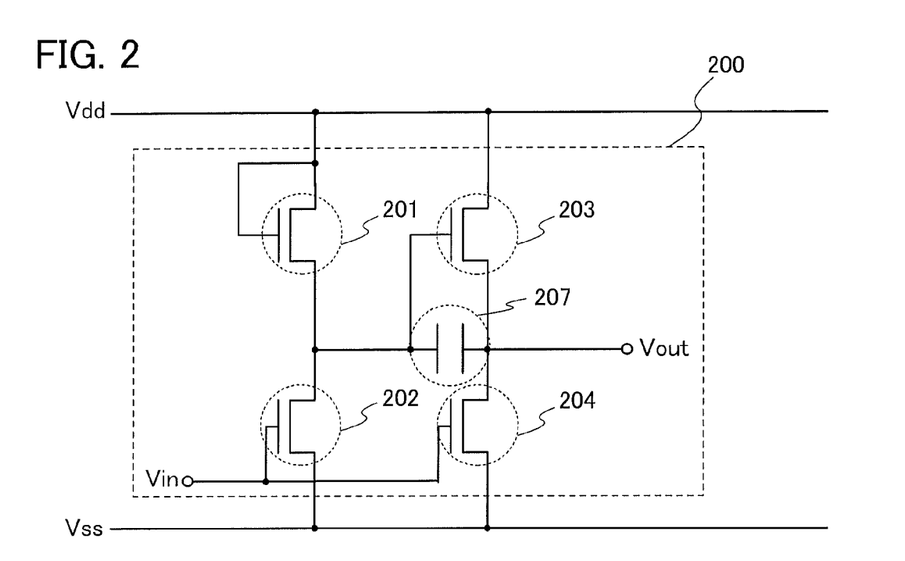
FIG. 2 illustrates an example of a buffer circuit.

FIG. 2 illustrates a buffer circuit 200.

The buffer circuit 200 illustrated in FIG. 2 includes first to fourth transistors, a capacitor, an input portion, and an output portion. A first terminal and a third terminal of a first transistor 201 are connected to a high-potential-side power supply line $V_{dd}$, and a second terminal thereof is connected to a first terminal of a second transistor 202 and a third terminal of a third transistor 203. A second terminal of the second transistor 202 is connected to a low-potential-side power supply line $V_{ss}$, and a third terminal thereof is connected to an input portion $V_{in}$ of the buffer circuit 200. A first terminal of the third transistor 203 is connected to the high-potential-side power supply line $V_{dd}$, and a second terminal thereof is connected to a first terminal of a fourth transistor 204 and an output portion $V_{out}$ of the buffer circuit 200. A second terminal of the fourth transistor 204 is connected to the low-potential-side power supply line $V_{ss}$, and a third terminal thereof is connected to the input portion $V_{in}$ of the buffer circuit 200. The second terminal of the first transistor 201 is connected to the output portion $V_{out}$ through a capacitor 207.

Here, when the gain of the first transistor 201 is expressed by $g_1$, the gain of the second transistor 202 is expressed by $g_2$, the gain of the third transistor 203 is expressed by $g_3$, the gain of the fourth transistor 204 is expressed by $g_4$, the angular frequency of an input signal is expressed by s (=$2\pi f$ (f represents frequency)), and the electrostatic capacitance of the capacitor 207 is expressed by C, the gain of the buffer circuit 200 illustrated in FIG. 2 can be expressed by the following mathematical formula (8).

[Mathematical Formula 8]

$$G = \frac{g_4(g_1 + sC)}{g_1(g_3 + sC)} + \frac{g_2}{g_1} \quad (8)$$

That is, s is significantly large when the frequency is high ($g_1$, $g_3 \ll sC$), so that the gain of the high-frequency component is expressed by the following mathematical formula (9) when the equation $1/s=0$ is satisfied.

[Mathematical Formula 9]

$$G_H = -\frac{g_2 + g_4}{g_1} \quad (9)$$

In addition, s is significantly small when the frequency is low ($g_1$, $g_3 \gg sC$), so that the gain of the low-frequency component is expressed by the following mathematical formula (10) when the equation $s=0$ is satisfied.

[Mathematical Formula 10]

$$G_L = -\left(\frac{g_4}{g_3} + \frac{g_2}{g_1}\right) \quad (10)$$

The gain of the third transistor 203 is not included in the above mathematical formula (9); thus, in the buffer circuit 200 illustrated in FIG. 2, the gain of the third transistor 203 does not contribute to an increase in gain of the high-frequency component. That is, the transistor of the last stage, which is connected to the high-potential-side power supply line, does not contribute to an increase in gain. Further, as can be seen from the above mathematical formula (10), when the gain of the third transistor 203 is increased, the transistor of the last stage acts to reduce the gain of the buffer circuit when the frequency is low.

On the other hand, in the buffer circuit 100 illustrated in FIG. 1, the transistor of the last stage, which is connected to the high-potential-side power supply line $V_{dd}$, contributes to an increase in gain; thus, the gain of the transistor of the last stage is increased by, for example, making the channel length of the transistor large. In such a manner, the gain of the buffer circuit can be increased.

Figure 3:
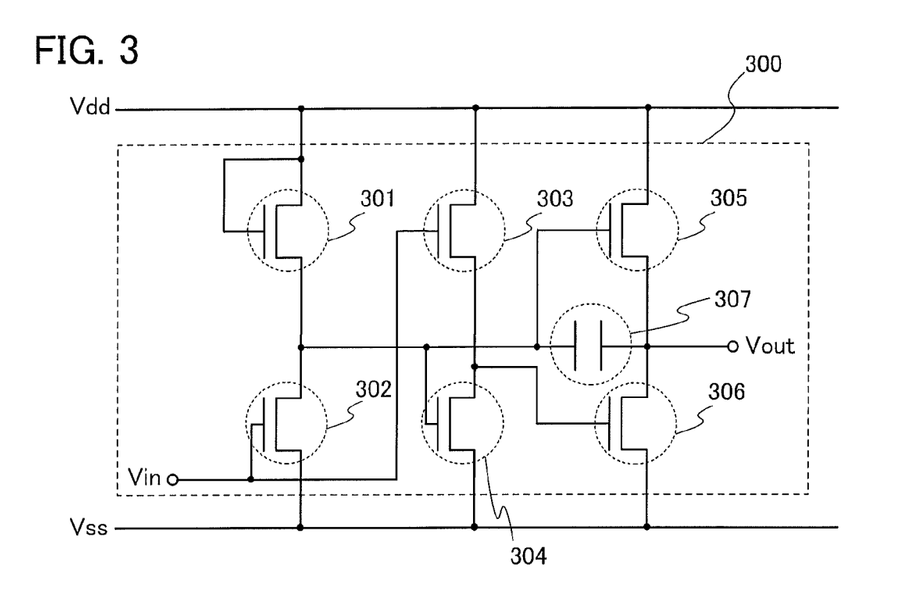
FIG. 3 illustrates an example of a buffer circuit.

FIG. 3 illustrates a buffer circuit 300.

The buffer circuit 300 illustrated in FIG. 3 includes first to sixth transistors, a capacitor, an input portion, and an output portion. A first terminal and a third terminal of a first transistor 301 are connected to a high-potential-side power supply line $V_{dd}$, and a second terminal thereof is connected to a first terminal of a second transistor 302, a third terminal of a fourth transistor 304, and a third terminal of a fifth transistor 305. A second terminal of the second transistor 302 is connected to a low-potential-side power supply line $V_{ss}$, and a third terminal thereof is connected to an input portion $V_{in}$ of the buffer circuit 300. A first terminal of a third transistor 303 is connected to the high-potential-side power supply line $V_{dd}$, a second terminal thereof is connected to a first terminal of the fourth transistor 304 and a third terminal of a sixth transistor 306, and a third terminal thereof is connected to the input portion $V_{in}$ of the buffer circuit 300. A second terminal of the fourth transistor 304 is connected to the low-potential-side power supply line $V_{ss}$. A first terminal of the fifth transistor 305 is connected to the high-potential-side power supply line $V_{dd}$, and a second terminal thereof is connected to a first terminal of the sixth transistor 306 and an output portion $V_{out}$ of the buffer circuit 300. A second terminal of the sixth transistor 306 is connected to the low-potential-side power supply line $V_{ss}$. The second terminal of the first transistor 301 is connected to the output portion $V_{out}$ of the buffer circuit 300 through a capacitor 307.

Here, when the gain of the first transistor 301 is expressed by $g_1$, the gain of the second transistor 302 is expressed by $g_2$, the gain of the third transistor 303 is expressed by $g_3$, the gain of the fourth transistor 304 is expressed by $g_4$, the gain of the fifth transistor 305 is expressed by $g_5$, the gain of the sixth transistor 306 is expressed by $g_6$, the angular frequency of an input signal is expressed by s (=2πf (f represents frequency)), and the electrostatic capacitance of the capacitor 307 is expressed by C, the gain of the buffer circuit 300 illustrated in FIG. 3 can be expressed by the following mathematical formula (11) when the frequency is high.

[Mathematical Formula 11]

$$G_H = -\frac{g_3(g_2 + g_6)}{g_1 g_3 - g_4 g_6} \quad (11)$$

On the other hand, the gain of the low-frequency component is expressed by the following mathematical formula (12).

[Mathematical Formula 12]

$$G_L = -\left(\frac{g_2 g_4 g_6}{g_1 g_3 g_5} + \frac{g_2}{g_1} + \frac{g_6}{g_5}\right) \quad (12)$$

The gain of the fifth transistor 305 is not included in the above mathematical formula (11); thus, in the buffer circuit 300 illustrated in FIG. 3, the gain of the fifth transistor 305 does not contribute to an increase in gain of the high-frequency component. That is, the transistor of the last stage, which is connected to the high-potential-side power supply line, does not contribute to an increase in gain. On the other hand, as described above, in the buffer circuit 100 illustrated in FIG. 1, the transistor of the last stage, which is connected to the high-potential-side power supply line, contributes to an increase in gain; thus, the gain of the transistor of the last stage is increased by, for example, making the channel length of the transistor large. In such a manner, the gain of the buffer circuit can be increased.

As described in this embodiment, the buffer circuit illustrated in FIG. 1, which is one embodiment of the present invention, is novel and has advantageous effects in comparison to conventional buffer circuits. The buffer circuit can be applied to a driver circuit of a display device, and the buffer circuit and a pixel portion can be formed over the same substrate.

[Embodiment 2]

In this embodiment, a buffer circuit provided with p-channel transistors, which is one embodiment of the present invention, will be described.

Figure 4:
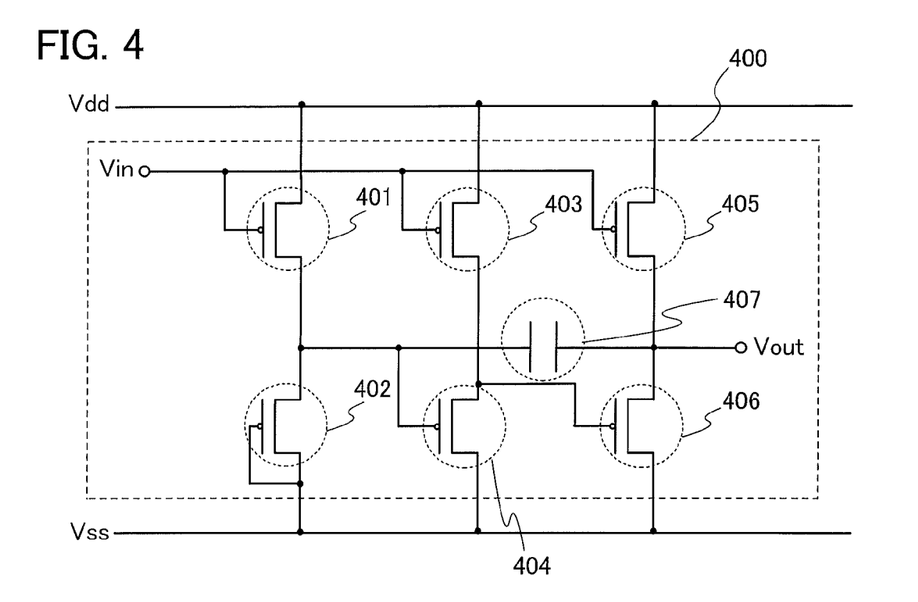
FIG. 4 illustrates a buffer circuit of Embodiment 2, which is one embodiment of the present invention.

FIG. 4 illustrates a buffer circuit 400 which is one embodiment of the present invention.

The buffer circuit 400 illustrated in FIG. 4 includes first to sixth transistors, a capacitor, an input portion, and an output portion. A first terminal of a first transistor 401 is connected to a high-potential-side power supply line $V_{dd}$, a second terminal thereof is connected to a first terminal of a second transistor 402 and a third terminal of a fourth transistor 404, and a third terminal thereof is connected to an input portion $V_{in}$ of the buffer circuit 400. A second terminal and a third terminal of the second transistor 402 are connected to a low-potential-side power supply line $V_{ss}$. A first terminal of a third transistor 403 is connected to the high-potential-side power supply line $V_{dd}$, a second terminal thereof is connected to a first terminal of the fourth transistor 404 and a third terminal of a sixth transistor 406, and a third terminal thereof is connected to the input portion $V_{in}$ of the buffer circuit 400. A second terminal of the fourth transistor 404 is connected to the low-potential-side power supply line $V_{ss}$. A first terminal of a fifth transistor 405 is connected to the high-potential-side power supply line $V_{dd}$, a second terminal thereof is connected to a first terminal of the sixth transistor 406 and an output portion $V_{out}$ of the buffer circuit, and a third terminal thereof is connected to the input portion $V_{in}$ of the buffer circuit 400. A second terminal of the sixth transistor 406 is connected to the low-potential-side power supply line $V_{ss}$. The second terminal of the first transistor 401 is connected to the output portion $V_{out}$ through a capacitor 407.

The buffer circuit 400 illustrated in FIG. 4 has high driving capability and high gain of a high-frequency component. Further, such a buffer circuit has high slew rate. Since such a buffer circuit can be formed using transistors having the same conductivity type, it can be manufactured through a simple process. In other words, the slew rate of a buffer circuit provided with transistors that have the same conductivity type can be improved, which has been conventionally difficult. In addition, the buffer circuit can be formed with six transistors and one capacitor, whereby the area occupied by the buffer circuit can be made small.

As described in this embodiment, the buffer circuit illustrated in FIG. 4, which is one embodiment of the present invention, is novel and has advantageous effects in comparison to conventional buffer circuits. The buffer circuit can be applied to a driver circuit of a display device, and the buffer circuit and a pixel portion can be formed over the same substrate.

This application is based on Japanese Patent Application serial no. 2010-110995 filed with Japan Patent Office on May 13, 2010, the entire contents of which are hereby incorporated by reference.

What is claimed is:

1. A semiconductor device comprising:
   a buffer circuit comprising:
      a first transistor;
      a second transistor;
      a third transistor;
      a fourth transistor;
      a fifth transistor;
      a sixth transistor;
      a capacitor;
      an input portion; and
      an output portion,
   wherein one of a source and a drain of the first transistor is connected to a gate of the first transistor,
   wherein the one of the source and the drain of the first transistor is connected to a first line,
   wherein the other of the source and the drain of the first transistor is connected to one of a source and a drain of the second transistor,
   wherein the one of the source and the drain of the second transistor is connected to a first electrode of the capacitor,
   wherein the other of the source and the drain of the second transistor is connected to a second line,
   wherein a gate of the second transistor is connected to the input portion of the buffer circuit,
   wherein a gate of the third transistor is connected to the first electrode of the capacitor,
   wherein one of a source and a drain of the third transistor is connected to the first line,
   wherein the other of the source and the drain of the third transistor is connected to one of a source and a drain of the fourth transistor,
   wherein the one of the source and the drain of the fourth transistor is connected to a gate of the fifth transistor,
   wherein the other of the source and the drain of the fourth transistor is connected to the second line,
   wherein a gate of the fourth transistor is connected to the input portion of the buffer circuit,
   wherein one of a source and a drain of the fifth transistor is connected to the first line,
   wherein the other of the source and the drain of the fifth transistor is connected to one of a source and a drain of the sixth transistor,
   wherein the one of the source and the drain of the sixth transistor is connected to the output portion of the buffer circuit,
   wherein the other of the source and the drain of the sixth transistor is connected to the second line,
   wherein a gate of the sixth transistor is connected to the input portion of the buffer circuit,
   wherein a second electrode of the capacitor is connected to the output portion of the buffer circuit, and
   wherein the first transistor, the second transistor, the third transistor, the fourth transistor, the fifth transistor, and the sixth transistor are each an n-channel transistor.

2. The semiconductor device according to claim 1,
   wherein the first line is a high-potential-side power supply line, and
   wherein the second line is a low-potential-side power supply line.

3. The semiconductor device according to claim 1, wherein the n-channel transistor comprises an oxide semiconductor.

4. A semiconductor device comprising:
   a buffer circuit comprising:
      a first transistor;
      a second transistor;
      a third transistor;
      a fourth transistor;
      a fifth transistor;
      a sixth transistor;
      a capacitor;
      an input portion; and
      an output portion,
   wherein one of a source and a drain of the first transistor is connected to a first line,
   wherein the other of the source and the drain of the first transistor is connected to one of a source and a drain of the second transistor,
   wherein a gate of the first transistor is connected to the input portion of the buffer circuit,
   wherein the one of the source and the drain of the second transistor is connected to a first electrode of the capacitor,
   wherein the other of the source and the drain of the second transistor is connected to a second line,
   wherein the other of the source and the drain of the second transistor is connected to a gate of the second transistor,
   wherein one of a source and a drain of the third transistor is connected to the first line,
   wherein the other of the source and the drain of the third transistor is connected to one of a source and a drain of the fourth transistor,
   wherein a gate of the third transistor is connected to the input portion of the buffer circuit,
   wherein the one of the source and the drain of the fourth transistor is connected to a gate of the sixth transistor,
   wherein the other of the source and the drain of the fourth transistor is connected to the second line,
   wherein one of a source and a drain of the fifth transistor is connected to the first line,
   wherein the other of the source and the drain of the fifth transistor is connected to one of a source and a drain of the sixth transistor,
   wherein a gate of the fifth transistor is connected to the input portion of the buffer circuit,
   wherein the one of the source and the drain of the sixth transistor is connected to the output portion of the buffer circuit,
   wherein the other of the source and the drain of the sixth transistor is connected to the second line,
   wherein a second electrode of the capacitor is connected to the output portion of the buffer circuit, and
   wherein the first transistor, the second transistor, the third transistor, the fourth transistor, the fifth transistor, and the sixth transistor are each a p-channel transistor.

5. The semiconductor device according to claim 4,
   wherein the first line is a high-potential-side power supply line, and
   wherein the second line is a low-potential-side power supply line.

6. A display device comprising:
a pixel portion; and
a driver circuit comprising:
  a first transistor;
  a second transistor;
  a third transistor;
  a fourth transistor;
  a fifth transistor;
  a sixth transistor; and
  a capacitor,
wherein one of a source and a drain of the first transistor is connected to a gate of the first transistor,
wherein the one of the source and the drain of the first transistor is connected to a first line,
wherein the other of the source and the drain of the first transistor is connected to one of a source and a drain of the second transistor,
wherein the one of the source and the drain of the second transistor is connected to a first electrode of the capacitor,
wherein the other of the source and the drain of the second transistor is connected to a second line,
wherein a gate of the third transistor is connected to the first electrode of the capacitor,
wherein one of a source and a drain of the third transistor is connected to the first line,
wherein the other of the source and the drain of the third transistor is connected to one of a source and a drain of the fourth transistor,
wherein the one of the source and the drain of the fourth transistor is connected to a gate of the fifth transistor,
wherein the other of the source and the drain of the fourth transistor is connected to the second line,
wherein a gate of the fourth transistor is connected to a gate of the second transistor,
wherein one of a source and a drain of the fifth transistor is connected to the first line,
wherein the other of the source and the drain of the fifth transistor is connected to one of a source and a drain of the sixth transistor,
wherein the one of the source and the drain of the sixth transistor is connected to a second electrode of the capacitor,
wherein the other of the source and the drain of the sixth transistor is connected to the second line,
wherein a gate of the sixth transistor is connected to the gate of the second transistor, and
wherein the first transistor, the second transistor, the third transistor, the fourth transistor, the fifth transistor, and the sixth transistor are each an n-channel transistor.

7. The display device according to claim 6,
wherein the first line is a high-potential-side power supply line, and
wherein the second line is a low-potential-side power supply line.

8. The display device according to claim 6, wherein the n-channel transistor comprises an oxide semiconductor.

9. A display device comprising:
a pixel portion; and
a driver circuit comprising:
  a first transistor;
  a second transistor;
  a third transistor;
  a fourth transistor;
  a fifth transistor;
  a sixth transistor; and
  a capacitor,
wherein one of a source and a drain of the first transistor is connected to a first line,
wherein the other of the source and the drain of the first transistor is connected to one of a source and a drain of the second transistor,
wherein the one of the source and the drain of the second transistor is connected to a first electrode of the capacitor,
wherein the other of the source and the drain of the second transistor is connected to a second line,
wherein the other of the source and the drain of the second transistor is connected to a gate of the second transistor,
wherein one of a source and a drain of the third transistor is connected to the first line,
wherein the other of the source and the drain of the third transistor is connected to one of a source and a drain of the fourth transistor,
wherein a gate of the third transistor is connected to a gate of the first transistor,
wherein the one of the source and the drain of the fourth transistor is connected to a gate of the sixth transistor,
wherein the other of the source and the drain of the fourth transistor is connected to the second line,
wherein one of a source and a drain of the fifth transistor is connected to the first line,
wherein the other of the source and the drain of the fifth transistor is connected to one of a source and a drain of the sixth transistor,
wherein a gate of the fifth transistor is connected to the gate of the first transistor,
wherein the one of the source and the drain of the sixth transistor is connected to a second electrode of the capacitor,
wherein the other of the source and the drain of the sixth transistor is connected to the second line, and
wherein the first transistor, the second transistor, the third transistor, the fourth transistor, the fifth transistor, and the sixth transistor are each a p-channel transistor.

10. The display device according to claim 9,
wherein the first line is a high-potential-side power supply line, and
wherein the second line is a low-potential-side power supply line.

* * * * *